United States Patent
Mizukami et al.

(10) Patent No.: US 12,456,789 B2
(45) Date of Patent: Oct. 28, 2025

(54) TRANSMISSION LINE COMPRISING AN ELEMENT BODY HAVING A SIGNAL CONDUCTOR LAYER WITH SECTIONS OF DIFFERING IMPEDANCES HAVING A SPECIFIED RELATIONSHIP

(71) Applicant: Murata Manufacturing Co., Ltd., Nagaokakyo (JP)

(72) Inventors: Ryutatsu Mizukami, Nagaokakyo (JP); Shuichi Kezuka, Nagaokakyo (JP); Kuniaki Yosui, Nagaokakyo (JP); Tomohiro Nagai, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 339 days.

(21) Appl. No.: 18/071,673

(22) Filed: Nov. 30, 2022

(65) Prior Publication Data
US 2023/0100141 A1 Mar. 30, 2023

Related U.S. Application Data

(63) Continuation of application No. PCT/JP2021/020197, filed on May 27, 2021.

(30) Foreign Application Priority Data

Jun. 11, 2020 (JP) .................. 2020-101538

(51) Int. Cl.
*H01P 5/02* (2006.01)
*H01P 3/08* (2006.01)

(52) U.S. Cl.
CPC ............... *H01P 5/028* (2013.01); *H01P 3/08* (2013.01); *H01P 3/085* (2013.01)

(58) Field of Classification Search
CPC ............ H01P 3/08; H01P 3/085; H01P 5/028
(Continued)

(56) References Cited

U.S. PATENT DOCUMENTS

| | | | | |
|---|---|---|---|---|
| 5,184,095 | A * | 2/1993 | Hanz et al. | ............ H05K 1/025 333/33 |
| 2010/0019870 | A1* | 1/2010 | Seino et al. | ............ H01P 5/02 333/24 C |

(Continued)

FOREIGN PATENT DOCUMENTS

| | | |
|---|---|---|
| JP | 2002043811 A | 2/2002 |
| WO | 2015118791 A1 | 8/2015 |
| WO | 2019216188 A1 | 11/2019 |

OTHER PUBLICATIONS

International Search Report in PCT/JP2021/020197, mailed Aug. 24, 2021, 3 pages.

(Continued)

*Primary Examiner* — Benny T Lee
(74) *Attorney, Agent, or Firm* — Keating & Bennett, LLP

(57) ABSTRACT

A transmission line includes an element body and a signal conductor layer in the element body and having a linear shape. The transmission line includes a first, second, and third impedance sections, an impedance conversion section, and a reflection section. The second impedance section, the reflection section, the first impedance section, the impedance conversion section, and the third impedance section are positioned in this order along the signal conductor layer. Characteristic impedance of the first impedance section is lower than characteristic impedance in the second impedance section and characteristic impedance in the third impedance section. A change amount of characteristic impedance per unit length in the reflection section is larger (Continued)

than a change amount of characteristic impedance per unit length in the impedance conversion section.

29 Claims, 14 Drawing Sheets

(58) Field of Classification Search
USPC .................................................. 333/33, 246
See application file for complete search history.

(56) References Cited

U.S. PATENT DOCUMENTS

2016/0156087 A1    6/2016   Baba et al.
2021/0029822 A1    1/2021   Yosui

OTHER PUBLICATIONS

Written Opinion in PCT/JP2021/020197, mailed Aug. 24, 2021, 3 pages.

* cited by examiner

Fig.1
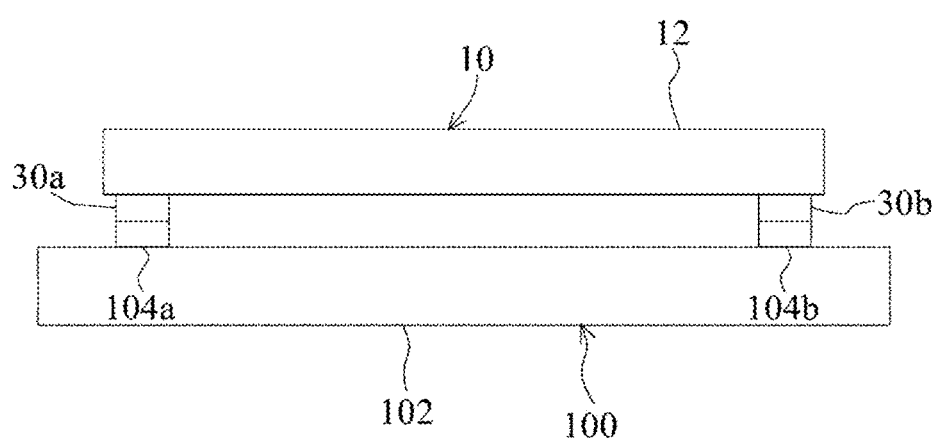
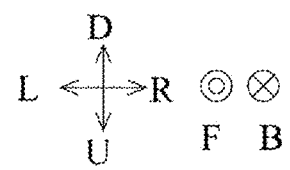

Fig.10
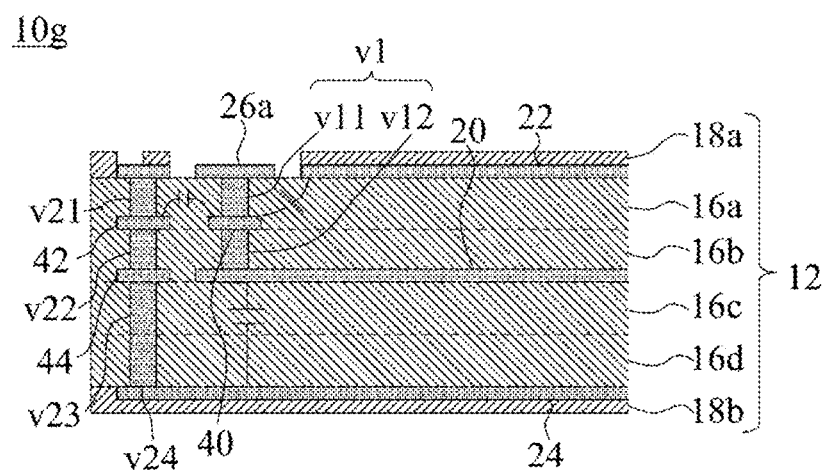
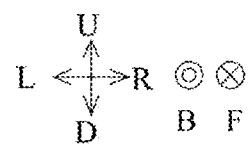

Fig.13
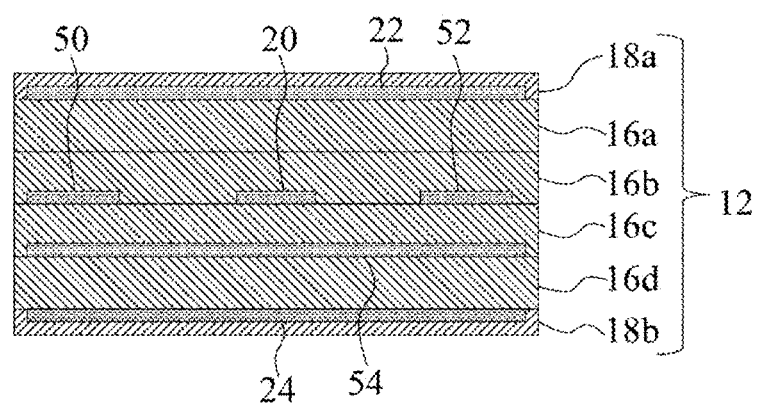
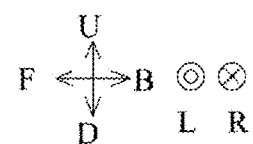

Fig.14
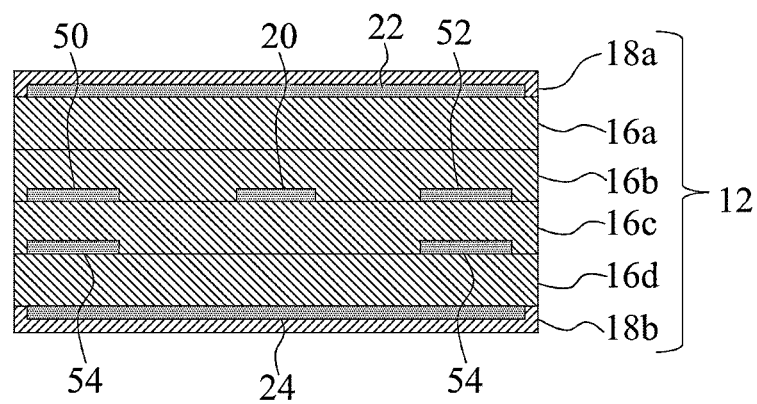
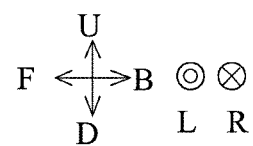

TRANSMISSION LINE COMPRISING AN ELEMENT BODY HAVING A SIGNAL CONDUCTOR LAYER WITH SECTIONS OF DIFFERING IMPEDANCES HAVING A SPECIFIED RELATIONSHIP

CROSS REFERENCE TO RELATED APPLICATIONS

This application claims the benefit of priority to Japanese Patent Application No. 2020-101538 filed on Jun. 11, 2020 and is a Continuation Application of PCT Application No. PCT/JP2021/020197 filed on May 27, 2021. The entire contents of each application are hereby incorporated herein by reference.

BACKGROUND OF THE INVENTION

1. Field of the Invention

The present invention relates to a transmission line through which a radio frequency signal is transmitted.

2. Description of the Related Art

As an invention related to a transmission line in the past, a radio frequency signal transmission line described in International Publication No. 2015/118791 is known, for example. The radio frequency signal transmission line includes a signal line. The signal line has a first end portion and a second end portion. The signal line includes a first section and a second section. In the first section, impedance, equal to or higher than a first impedance at the first end portion, occurs. In the second section, impedance lower than the first impedance occurs. The second section is longer than the first section so that a length of the second section having low impedance is long. As a result, insertion loss of a radio frequency signal transmission line is reduced.

In the radio frequency signal transmission line described in International Publication No. 2015/118791, a via-hole conductor is connected to the first end portion of the signal line, or a connector is electrically connected to the first end portion of the signal line. Thus, the impedance may vary at the via-hole or the connector. As a result, impedance mismatching may occur near the first end portion of the signal line.

SUMMARY OF THE INVENTION

Preferred embodiments of the present invention provide transmission lines that are each able to reduce or prevent characteristic impedance mismatching.

A transmission line according to a preferred embodiment of the present invention includes an element body, and a signal conductor layer in the element body and having a linear shape, wherein the transmission line includes a first impedance section, a second impedance section, a third impedance section, an impedance conversion section, and a reflection section, the second impedance section, the reflection section, the first impedance section, the impedance conversion section, and the third impedance section are positioned in this order along the signal conductor 1 layer, characteristic impedance in the first impedance section is lower than characteristic impedance in the second impedance section and characteristic impedance in the third impedance section, and a change amount of characteristic impedance per unit length in the reflection section is larger than a change amount of characteristic impedance per unit length in the impedance conversion section.

A transmission line according to a preferred embodiment of the present invention includes an element body, a signal conductor layer in the element body, wherein the transmission line includes a first impedance section, a second impedance section, a third impedance section, an impedance conversion section, and a reflection section, the second impedance section, the reflection section, the first impedance section, the impedance conversion section, and the third impedance section are positioned in this order along the signal conductor layer, a line width of the signal conductor layer in the first impedance section is larger than a line width of the signal conductor layer in the second impedance section and a line width of the signal conductor layer in the third impedance section, and a change amount of a line width of the signal conductor layer per unit length in the reflection section is larger than a change amount of a line width of the signal conductor layer per unit length in the impedance conversion section.

Hereinafter, definitions of terms in the present description will be described. In the present description, an axis or a member extending in a front-back direction does not necessarily indicate only an axis or a member parallel or substantially parallel to the front-back direction. The axis or the member extending in the front-back direction is an axis or a member inclined within a range of about ±45° relative to the front-back direction. Similarly, an axis or a member extending in an up-down direction refers to an axis or a member inclined within a range of about ±45° relative to the up-down direction. An axis or a member extending in a left-right direction is an axis or a member inclined within a range of about ±45° relative to the left-right direction.

Hereinafter, a first member to a third member mean members and the like included in a transmission line. In the present description, unless otherwise specified, each portion of the first member is defined as follows. A front portion of the first member means a front half of the first member. A back portion of the first member means a back half of the first member. A left portion of the first member means a left half of the first member. A right portion of the first member means a right half of the first member. An upper portion of the first member means an upper half of the first member. A lower portion of the first member means a lower half of the first member. A front end of the first member means an end in a front direction of the first member. A back end of the first member means an end in a back direction of the first member. A left end of the first member means an end in a left direction of the first member. A right end of the first member means an end in a right direction of the first member. An upper end of the first member means an end in an upper direction of the first member. A lower end of the first member means an end in a lower direction of the first member. A front end portion of the first member means the front end of the first member and a vicinity thereof. A back end portion of the first member means the back end of the first member and a vicinity thereof. A left end portion of the first member means the left end of the first member and a vicinity thereof. A right end portion of the first member means the right end of the first member and a vicinity thereof. An upper end portion of the first member means the upper end of the first member and a vicinity thereof. A lower end portion of the first member means the lower end of the first member and a vicinity thereof.

In the present description, the expression "a first member and a second member are electrically connected" means that a current can flow between the first member and the second member. Accordingly, the first member and the second member may be in contact with each other, or the first member and the second member do not have to be in contact with each other. When the first member and the second member are not in contact with each other, a third member having conductivity is positioned between the first member and the second member.

With the use of the transmission lines according to preferred embodiments of the present invention, it is possible to reduce or prevent characteristic impedance mismatching.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 1 is a front view of an electronic device according to a preferred embodiment of the present invention.

FIG. 10 is a sectional view of a left end portion of a transmission line according to a preferred embodiment of the present invention.

FIG. 13 is a sectional view of the transmission line taken along line B-B in FIG. 12.

FIG. 14 is a sectional view of the transmission line taken along line A-A and line C-C in FIG. 12.

DETAILED DESCRIPTION OF THE PREFERRED EMBODIMENTS

Preferred Embodiment

Structure of Transmission Line

Figure 2:
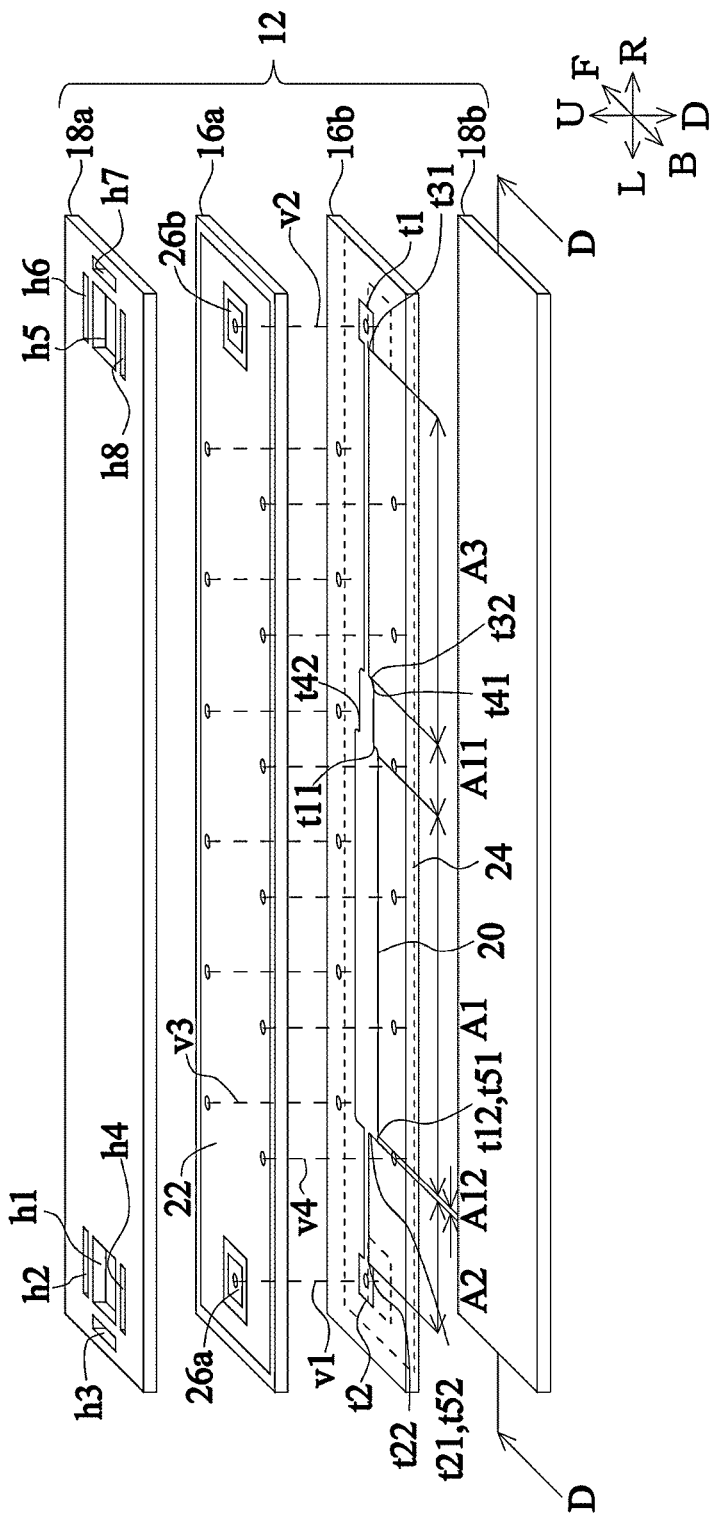
FIG. 2 is an exploded perspective view of a transmission line according to a preferred embodiment of the present invention.
Figure 3:
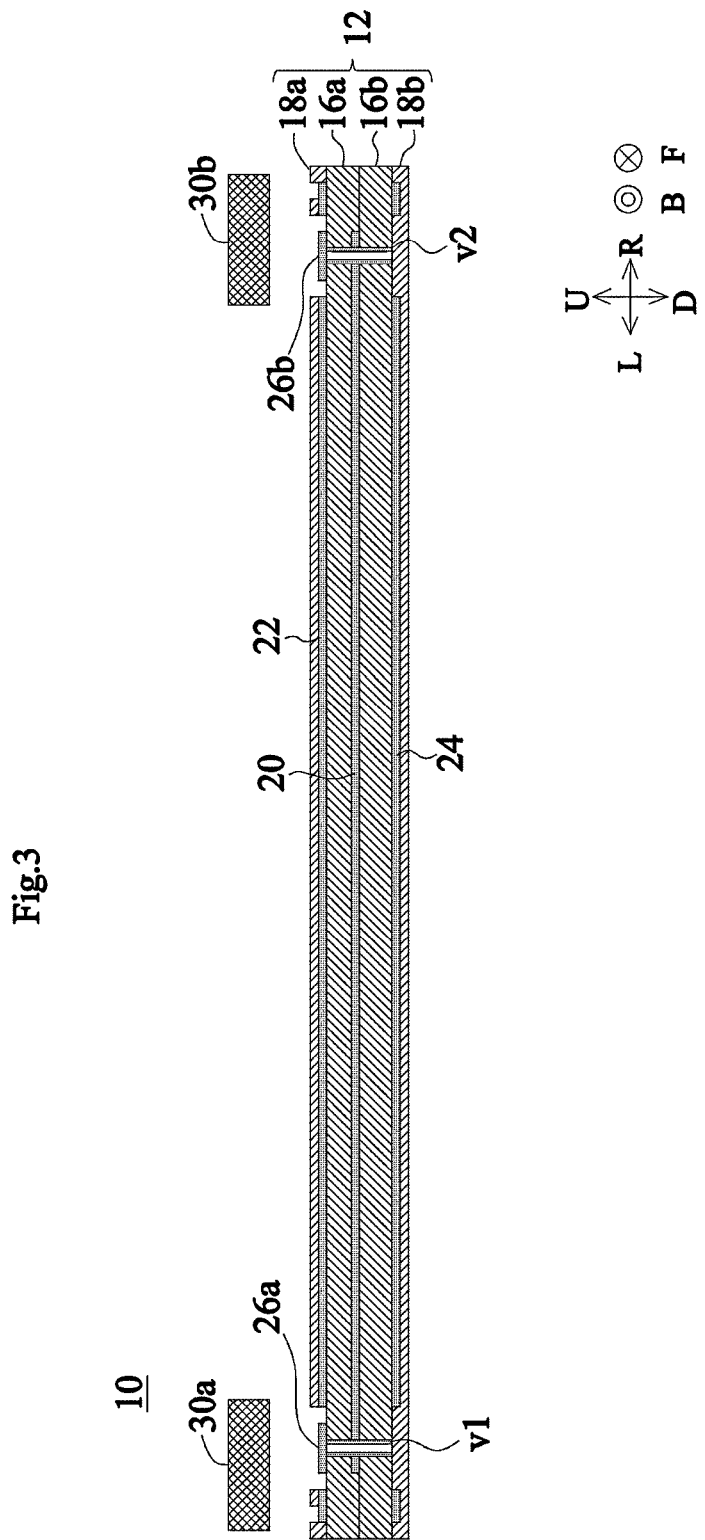
FIG. 3 is a sectional view taken along line D-D in FIG. 2.

Hereinafter, a transmission line 10 according to a preferred embodiment of the present invention will be described with reference to the drawings. FIG. 1 is a front view of an electronic device 1. FIG. 2 is an exploded perspective view of the transmission line 10. FIG. 3 is a sectional view taken along line D-D in FIG. 2.

In the present description, directions are defined as follows. A lamination direction of an element body 12 of the transmission line 10 is defined as an up-down (i.e. U-D) direction. A direction in which a signal conductor layer 20 of the transmission line 10 extends is defined as a left-right (i.e. L-R) direction. A line width direction of the signal conductor layer 20 of the transmission line 10 is defined as a front-back (i.e. F-B) direction. The up-down direction, the front-back direction, and the left-right direction are orthogonal or substantially orthogonal to each other. The definition of the directions in the present description is an example. Accordingly, the direction in actual use of the transmission line 10 does not need to coincide with the direction in the present description. In FIG. 1, for convenience of explanation, the up-down direction in the illustration is opposite to the up-down direction.

The electronic device 1 is a smartphone or a tablet portable terminal, for example. The electronic device 1 includes the transmission line 10, connectors 30a and 30b, and a circuit substrate 100 as illustrated in FIG. 1.

The circuit substrate 100 includes a substrate main body 102 and connectors 104a and 104b. The substrate main body 102 has a plate shape. Accordingly, the substrate main body 102 includes an upper main surface and a lower main surface. Further, the substrate main body 102 includes a wiring conductor layer, a ground conductor layer, an electrode, and the like (not illustrated). Furthermore, for example, electronic components, semiconductor integrated circuits, and the like (not illustrated) are mounted on the lower main surface of the substrate main body 102. The connectors 104a and 104b are mounted on the lower main surface of the substrate main body 102.

The connector 30a (FIG. 3) is mounted on a left end portion of an upper main surface of the transmission line 10. The connector 30a is connected to the connector 104a. The connector 30b (FIG. 3) is mounted on a right end portion of the upper main surface of the transmission line 10. The connector 30b is connected to the connector 104b.

The transmission line 10 is used to electrically connect two electronic circuits in the electronic device 1. In the present preferred embodiment, the transmission line 10 electrically connects two portions of one circuit substrate 100. The transmission line 10 may electrically connect multiple circuit substrates. Further, the transmission line 10 may be bent in the up-down direction.

The transmission line 10 includes the element body 12, the signal conductor layer 20, a first ground conductor layer 22, a second ground conductor layer 24, outer electrodes 26a and 26b, and interlayer connection conductors v1, v2, v3, and v4 as illustrated in FIG. 2 and FIG. 3. In FIG. 2, representative interlayer connection conductors among multiple interlayer connection conductors v3 and v4 are denoted by reference signs.

The element body 12 has a plate shape. The element body 12 has a rectangular or substantially rectangular shape including long sides extending in the left-right direction when viewed in the up-down direction as illustrated in FIG. 2. Accordingly, a length of the element body 12 in the left-right direction is longer than a length of the element body 12 in the front-back direction. The element body 12 has flexibility. Accordingly, the transmission line 10 may be bent in the up-down direction in the electronic device 1.

The element body 12 has a structure in which insulator layers 16a and 16b and resist layers 18a and 18b are laminated in the up-down direction (lamination direction) as illustrated in FIG. 2 and FIG. 3. The resist layer 18a, the insulator layers 16a and 16b, and the resist layer 18b are laminated in this order from top to bottom. The insulator layers 16a and 16b are dielectric sheets having flexibility. The material of the insulator layers 16a and 16b is, for example, thermoplastic resin, such as polyimide or liquid crystal polymer. The insulator layers 16a and 16b have the same or substantially the same rectangular or substantially rectangular shape as the element body 12 when viewed in the up-down direction. Details of the resist layers 18a and 18b will be described later.

The signal conductor layer 20 is provided in the element body 12 as illustrated in FIG. 2. More specifically, the signal conductor layer 20 is provided on an upper main surface of the insulator layer 16b. Thus, the signal conductor layer 20 is provided in the element body 12. The signal conductor layer 20 has a linear shape. The signal conductor layer 20 extends in the left-right direction. The signal conductor layer 20 is positioned at a center or approximate center in the front-back direction of the upper main surface of the insulator layer 16b. The signal conductor layer 20 includes a signal conductor layer first end portion t1 and a signal conductor layer second end portion t2. The signal conductor layer first end portion t1 is a right end portion of the signal conductor layer 20. The signal conductor layer second end portion t2 is a left end portion of the signal conductor layer 20. The signal conductor layer first end portion t1 is positioned at a right end portion of the insulator layer 16b. The signal conductor layer second end portion t2 is positioned at a left end portion of the insulator layer 16b. A radio frequency signal is transmitted through the signal conductor layer 20. A frequency of the radio frequency signal is about 60 GHZ, for example.

The first ground conductor layer 22 is provided in the element body 12. The first ground conductor layer 22 is positioned above the signal conductor layer 20 to overlap the signal conductor layer 20 when viewed in the up-down direction. In the present description, the expression "the first ground conductor layer 22 is positioned above the signal conductor layer 20" refers to the following configuration. At least a portion of the first ground conductor layer 22 is positioned right above the signal conductor layer 20. That is, a portion of the first ground conductor layer 22 may be positioned right above the signal conductor layer 20, and the remaining portion of the first ground conductor layer 22 does not have to be positioned right above the signal conductor layer 20. The expression "the first ground conductor layer 22 is positioned above the signal conductor layer 20" does not include a configuration in which the entire first ground conductor layer 22 is positioned obliquely upward. In the present preferred embodiment, a portion of the first ground conductor layer 22 is positioned right above the signal conductor layer 20.

The first ground conductor layer 22 is provided on an upper main surface of the insulator layer 16a. The first ground conductor layer 22 has a rectangular or substantially rectangular shape including long sides extending in the left-right direction when viewed in the up-down direction as illustrated in FIG. 2. The first ground conductor layer 22 has a shape coinciding or substantially coinciding with the element body 12 when viewed in the up-down direction. The first ground conductor layer 22 is slightly smaller than the element body 12 when viewed in the up-down direction. The first ground conductor layer 22 is connected to a ground.

The second ground conductor layer 24 is provided in the element body 12. The second ground conductor layer 24 is positioned below the signal conductor layer 20 to overlap the signal conductor layer 20 when viewed in the up-down direction. More specifically, the second ground conductor layer 24 is provided on a lower main surface of the insulator layer 16b. The second ground conductor layer 24 has a rectangular or substantially rectangular shape including long sides extending in the left-right direction when viewed in the up-down direction as illustrated in FIG. 2. The second ground conductor layer 24 has a shape coinciding or substantially coinciding with the element body 12 when viewed in the up-down direction. The second ground conductor layer 24 is slightly smaller than the element body 12 when viewed in the up-down direction. The second ground conductor layer 24 is connected to the ground. The signal conductor layer 20, the first ground conductor layer 22, and the second ground conductor layer 24 described above have a stripline structure.

The outer electrode 26a is provided at a left end portion of the upper main surface of the insulator layer 16a. The outer electrode 26a has a rectangular or substantially rectangular shape when viewed in the up-down direction. The first ground conductor layer 22 is not provided around the outer electrode 26a so that the outer electrode 26a is insulated from the first ground conductor layer 22. The outer electrode 26a overlaps the signal conductor layer second end portion t2 when viewed in the up-down direction. A radio frequency signal is inputted to or outputted from the signal conductor layer 20 through the outer electrode 26a. The outer electrode 26a and the outer electrode 26b are symmetrical or substantially symmetrical in the left-right direction. Accordingly, a description of the outer electrode 26b is omitted.

The signal conductor layer 20, the first ground conductor layer 22, the second ground conductor layer 24, and the outer electrodes 26a and 26b described above are formed by etching copper foil provided on the upper main surface or the lower main surface of the insulator layers 16a and 16b, for example.

The resist layers 18a and 18b are flexible insulator layers. The resist layers 18a and 18b have the same or substantially the same rectangular or substantially rectangular shape as the element body 12 when viewed in the up-down direction.

The resist layer 18a covers the entire or substantially the entire upper main surface of the insulator layer 16a. Thus, the resist layer 18a protects the first ground conductor layer 22. Openings h1, h2, h3, h4, h5, h6, h7, and h8 are provided in the resist layer 18a. The opening h1 overlaps the outer electrode 26a when viewed in the up-down direction. Thus, the outer electrode 26a is exposed to the outside from the transmission line 10 through the opening h1. The opening h2 is provided in front of the opening h1. The opening h3 is provided to the left of the opening h1. The opening h4 is provided in back of the opening h1. Thus, the first ground conductor layer 22 is exposed to the outside from the transmission line 10 through the openings h2 to h4. The openings h1 to h4 and the openings h5 to h8 are symmetrical or substantially symmetrical in the left-right direction, respectively. Accordingly, description of the openings h5 to h8 will be omitted.

The connector 30a is mounted on the outer electrode 26a and the first ground conductor layer 22 exposed from the openings h1 to h4. Thus, the connector 30a is electrically connected to the signal conductor layer second end portion t2.

The connector 30b is mounted on the outer electrode 26b and the first ground conductor layer 22 exposed from the openings h5 to h8. Thus, the connector 30b is electrically connected to the signal conductor layer first end portion t1.

The resist layer 18b covers the entire or substantially the entire lower main surface of the insulator layer 16b. Thus, the resist layer 18b protects the second ground conductor layer 24.

The interlayer connection conductor v1 is provided at the left end portion of the insulator layers 16a and 16b. The interlayer connection conductor v1 passes through at least one insulator layer of the insulator layers 16a and 16b in the up-down direction (lamination direction). In the present preferred embodiment, the interlayer connection conductor v1 passes through the insulator layers 16a and 16b in the up-down direction. The interlayer connection conductor v1 is connected to the signal conductor layer second end portion t2. Specifically, an intermediate portion of the interlayer connection conductor v1 is connected to the signal conductor layer second end portion t2. An upper end of the interlayer connection conductor v1 is connected to the outer electrode 26a. Thus, the interlayer connection conductor v1 electrically connects the signal conductor layer 20 and the outer electrode 26a. Further, the second ground conductor layer 24 is not provided around the interlayer connection conductor v1 so that the interlayer connection conductor v1 is insulated from the second ground conductor layer 24. The interlayer connection conductor v1 and the interlayer connection conductor v2 are symmetrical or substantially symmetrical in the left-right direction. Accordingly, a description of the interlayer connection conductor v2 will be omitted.

The multiple interlayer connection conductors v3 are provided in the element body 12 so as to be positioned in front of the signal conductor layer 20. The multiple interlayer connection conductors v3 are arranged in a row at regular or substantially regular intervals in the left-right direction. The multiple interlayer connection conductors v3 pass through the insulator layers 16a and 16b in the up-down direction. Upper ends of the multiple interlayer connection conductors v3 are connected to the first ground conductor layer 22. Lower ends of the multiple interlayer connection conductors v3 are connected to the second ground conductor layer 24. Thus, the multiple interlayer connection conductors v3 electrically connect the first ground conductor layer 22 and the second ground conductor layer 24.

The multiple interlayer connection conductors v4 are provided in the element body 12 so as to be positioned in back of the signal conductor layer 20. The multiple interlayer connection conductors v4 are arranged in a row at regular or substantially rectangular intervals in the left-right direction. The multiple interlayer connection conductors v4 pass through the insulator layers 16a and 16b in the up-down direction. Upper ends of the multiple interlayer connection conductors v4 are connected to the first ground conductor layer 22. Lower ends of the multiple interlayer connection conductors v4 are connected to the second ground conductor layer 24. Thus, the multiple interlayer connection conductors v4 electrically connect the first ground conductor layer 22 and the second ground conductor layer 24.

Each of the interlayer connection conductors v1 to v4 described above is a through-hole conductor. The through-hole conductor is formed by, for example, forming a through-hole in the insulator layers 16a and 16b by using a drill or a laser beam, and then forming a conductor on an inner circumferential surface of the through-hole by plating. A cavity is provided at a center or approximate center of the through-hole conductor as illustrated in FIG. 3. A cavity does not have to be provided in a through-hole conductor.

The transmission line 10 includes a first impedance section A1, a second impedance section A2, a third impedance section A3, an impedance conversion section A11, and a reflection section A12 as illustrated in FIG. 2. The first impedance section A1 includes a first impedance section first end t11 and a first impedance section second end t12. The first impedance section first end t11 is a right end of the first impedance section A1. The first impedance section second end t12 is a left end of the first impedance section A1.

The second impedance section A2 includes a second impedance section first end t21 and a second impedance section second end t22. The second impedance section first end t21 is a right end of the second impedance section A2. The second impedance section second end t22 is a left end of the second impedance section A2.

The third impedance section A3 includes a third impedance section first end t31 and a third impedance section second end t32. The third impedance section first end t31 is a right end of the third impedance section A3. The third impedance section second end t32 is a left end of the third impedance section A3.

The impedance conversion section A11 includes an impedance conversion section first end t41 and an impedance conversion section second end t42. The impedance conversion section first end t41 is a right end of the impedance conversion section A11. The impedance conversion section second end t42 is a left end of the impedance conversion section A11.

The reflection section A12 includes a reflection section first end t51 and a reflection section second end t52. The reflection section first end t51 is a right end of the reflection section A12. The reflection section second end t52 is a left end of the reflection section A12.

The second impedance section A2, the reflection section A12, the first impedance section A1, the impedance conversion section A11, and the third impedance section A3 are continuously arranged in this order along the signal conductor layer 20. The expression "continuously arranged" means that adjacent sections are arranged in a state of being in contact with each other. Accordingly, the reflection section second end t52 is in contact with the second impedance section first end t21. Further, the reflection section first end t51 is in contact with the first impedance section second end t12. The impedance conversion section second end t42 is in contact with the first impedance section first end t11. The impedance conversion section first end t41 is in contact with the third impedance section second end t32.

Characteristic impedance in the first impedance section A1 is lower than characteristic impedance in the second impedance section A2 and characteristic impedance in the third impedance section A3. The characteristic impedance in the first impedance section A1 is about 40Ω, for example. The characteristic impedance in the second impedance section A2 and the characteristic impedance in the third impedance section A3 are about 50Ω, for example. Thus, a line width of the signal conductor layer 20 in the first impedance section A1 is larger than a line width of the signal conductor layer 20 in the second impedance section A2 and a line width of the signal conductor layer 20 in the third impedance section A3. The line width of the signal conductor layer 20 in the second impedance section A2 is equal or substantially equal to the line width of the signal conductor layer 20 in the third impedance section A3.

The reflection section A12 reflects a radio frequency signal inputted from the first impedance section A1 back to the first impedance section A1. The reflection section A12 reflects a radio frequency signal inputted from the second impedance section A2 back to the second impedance section A2. Thus, the reflection section A12 causes an abrupt change in impedance between the first impedance section A1 and the second impedance section A2.

A change amount of characteristic impedance in the reflection section A12 is larger than a change amount of the characteristic impedance in the first impedance section A1, a change amount of the characteristic impedance in the second impedance section A2, and a change amount of the characteristic impedance in the third impedance section A3. In the present description, a change amount of characteristic impedance in a section (reflection section A12, for example) is a difference between a maximum value of the characteristic impedance in the section and a minimum value of the characteristic impedance in the section. In the present preferred embodiment, for example, the characteristic impedance in the second impedance section A2 and the characteristic impedance in the third impedance section A3 are constant or substantially constant at about 50Ω. The characteristic impedance in the first impedance section A1 is constant or substantially constant at about 40Ω. Meanwhile, the characteristic impedance in the reflection section A12 is about 40Ω or more and about 50Ω or less. Accordingly, the change amount of the characteristic impedance in the reflection section A12 is about 10Ω.

Further, the characteristic impedance in the reflection section A12 decreases from the second impedance section A2 toward the first impedance section A1. Furthermore, the characteristic impedance in the reflection section A12 is equal to or higher than the characteristic impedance in the first impedance section A1, and equal to or lower than the characteristic impedance in the second impedance section A2. Thus, a line width of the signal conductor layer 20 in the reflection section A12 increases from the second impedance section A2 toward the first impedance section A1. The increase here includes both a discontinuous increase and a continuous increase. Further, the line width of the signal conductor layer 20 in the reflection section A12 is equal to or larger than the line width of the signal conductor layer 20 in the second impedance section A2, and equal to or smaller than the line width of the signal conductor layer 20 in the first impedance section A1. In the present preferred embodiment, since a side extending in the left-right direction and a side extending in the front-back direction are connected in the signal conductor layer 20, the line width of the signal conductor layer 20 abruptly changes in the reflection section A12. The signal conductor layer 20 is chamfered. A portion where the side extending in the left-right direction and the side extending in the front-back direction are connected is chamfered. Accordingly, the reflection section A12 includes a side extending in the front-back direction and a chamfered portion. Thus, a length of the reflection section A12 is very short. In the present description, a length of a section (reflection section A12, for example) is a length of the section in the left-right direction. When the portion where the side extending in the left-right direction and the side extending in the front-back direction are connected is not chamfered, the reflection section A12 is a region overlapping the side extending in the front-back direction of the signal conductor layer 20. In the case above, the reflection section A12 is a boundary between the first impedance section second end t12 and the second impedance section first end t21. That is, the length of the reflection section A12 is zero or substantially zero.

The impedance conversion section A11 transmits a radio frequency signal, inputted from the first impedance section A1, toward the third impedance section A3 while reducing or preventing reflection. The impedance conversion section A11 transmits a radio frequency signal, inputted from the third impedance section A3, toward the first impedance section A1 while reducing or preventing reflection. Thus, the impedance conversion section A11 causes a gradual change in impedance between the first impedance section A1 and the third impedance section A3.

A change amount of characteristic impedance in the impedance conversion section A11 is larger than the change amount of the characteristic impedance in the first impedance section A1, the change amount of the characteristic impedance in the second impedance section A2, and the change amount of the characteristic impedance in the third impedance section A3. In the present preferred embodiment, for example, the characteristic impedance in the second impedance section A2 and the characteristic impedance in the third impedance section A3 are constant or substantially constant at about 50Ω. The characteristic impedance in the first impedance section A1 is constant or substantially constant at about 40Ω. Meanwhile, the characteristic impedance in the impedance conversion section A11 is about 40Ω or more and about 50Ω or less. Accordingly, the change amount t of the characteristic impedance in the impedance conversion section A11 is about 10Ω.

The characteristic impedance in the impedance conversion section A11 decreases from the third impedance section A3 toward the first impedance section A1. The decrease here includes both a discontinuous decrease and a continuous decrease. Further, the characteristic impedance in the impedance conversion section A11 is equal to or higher than the characteristic impedance in the first impedance section A1 and is equal to or lower than the characteristic impedance in the third impedance section A3. Thus, a line width of the signal conductor layer 20 in the impedance conversion section A11 increases from the third impedance section A3 toward the first impedance section A1. The increase here includes both a discontinuous increase and a continuous increase. The line width of the signal conductor layer 20 in the impedance conversion section A11 is equal to or larger than the line width of the signal conductor layer 20 in the third impedance section A3 and equal to or smaller than the line width of the signal conductor layer 20 in the first impedance section A1. In the present preferred embodiment, the line width of the signal conductor layer 20 changes stepwise in the impedance conversion section A11.

A length of the signal conductor layer 20 in the impedance conversion section A11 is equal or substantially equal to the total length of an integer multiple of a half-wavelength of a radio frequency signal transmitted through the transmission line 10 and one fourth of a wavelength of the radio frequency signal. In the present preferred embodiment, the length of the impedance conversion section A11 is equal or substantially equal to one fourth of a wavelength of a radio frequency signal transmitted through the transmission line 10, for example.

A change amount of the characteristic impedance per unit length in the reflection section A12 is larger than a change amount of the characteristic impedance per unit length in the impedance conversion section A11. In the present description, a change amount of characteristic impedance per unit length in a section (reflection section A12, for example) is a value obtained by dividing a difference between a maximum value of the characteristic impedance in the section and a minimum value of the characteristic impedance in the section by a length of the section. Note that, when the length of the reflection section A12 is zero, the change amount of the characteristic impedance per unit length in the reflection section A12 is infinite. The length of the impedance conversion section A11 is not zero. Accordingly, the change amount of the characteristic impedance per unit length in the impedance conversion section A11 is a finite value. Thus, the change amount of the characteristic impedance per unit length in the reflection section A12 is larger than the change amount of the characteristic impedance per unit length in the impedance conversion section A11.

In the present preferred embodiment, a change amount of the line width of the signal conductor layer 20 in the reflection section A12 is equal to a change amount of the line width of the signal conductor layer 20 in the impedance conversion section A11. Thus, the length of the reflection section A12 is shorter than the length of the impedance conversion section A11. Thus, the change amount of the line width of the signal conductor layer 20 per unit length in the reflection section A12 is larger than the change amount of the line width of the signal conductor layer 20 per unit length in the impedance conversion section A11. That is, an increase rate of the line width of the signal conductor layer 20 in the reflection section A12 is larger than an increase rate of the line width of the signal conductor layer 20 in the impedance conversion section A11.

A length of the signal conductor layer 20 from the reflection section A12 to the signal conductor layer second end portion t2 is shorter than a length of the signal conductor layer 20 from the impedance conversion section A11 to the signal conductor layer first end portion t1. The length of the signal conductor layer 20 from the reflection section A12 to the signal conductor layer second end portion t2 is preferably equal to or shorter than a wavelength of a radio frequency signal transmitted through the transmission line 10.

Further, no chip capacitor is mounted in the second impedance section A2 or in the reflection section A12. The chip capacitor is an electronic component defining a matching circuit for impedance matching between the connector 30a and the transmission line 10, for example.

Advantageous Effects

With the use of the transmission line 10, the occurrence of characteristic impedance mismatching may be reduced or prevented. More specifically, the signal conductor layer second end portion t2 is connected to the interlayer connection conductor v1. Further, the signal conductor layer second end portion t2 is electrically connected to the connector 30a. Thus, impedance mismatching is likely to occur in the vicinity of the signal conductor layer second end portion t2.

Thus, the transmission line 10 includes the reflection section A12. The change amount of the characteristic impedance per unit length in the reflection section A12 is larger than the change amount of the characteristic impedance per unit length in the impedance conversion section A11. Thus, the reflection section A12 serves to reflect a radio frequency signal inputted from the second impedance section A2 back to the second impedance section A2. By using the reflection above, reflection of a radio frequency signal at the signal conductor layer second end portion t2 is reduced or prevented. As a result, the occurrence of impedance mismatching in the vicinity of the signal conductor layer second end portion t2 is reduced or prevented. Thus, a chip capacitor for impedance matching does not have to be mounted in the first impedance section A1 or the reflection section A12.

In particular, in the transmission line 10, the length of the signal conductor layer 20 in the impedance conversion section A11 is equal or substantially equal to the total length of an integer multiple of a half-wavelength of a radio frequency signal transmitted through the transmission line 10 and one fourth of a wavelength of the radio frequency signal. Thus, unnecessary reflection in the impedance conversion section A11 is reduced or prevented.

With the use of the transmission line 10, it is possible to reduce insertion loss of the transmission line 10. More specifically, the characteristic impedance in the reflection section A12 is equal to or higher than the characteristic impedance in the first impedance section A1, and equal to or lower than the characteristic impedance in the second impedance section A2. The characteristic impedance in the impedance conversion section A11 is equal to or higher than the characteristic impedance in the first impedance section A1, and equal to or lower than the characteristic impedance in the third impedance section A3. Thus, the characteristic impedance in the impedance conversion section A11 and the characteristic impedance in the reflection section A12 is reduced or prevented from becoming unnecessarily high. As a result, the insertion loss of the transmission line 10 may be reduced.

In the transmission line 10, the length of the reflection section A12 is shorter than the length of the impedance conversion section A11. Thus, the characteristic impedance tends to abruptly change in the reflection section A12. Accordingly, in the transmission line 10, reflection of a radio frequency signal is likely to occur in the reflection section A12.

With the use of the transmission line 10, it is possible to reduce the insertion loss of the transmission line 10. More specifically, the line width of the signal conductor layer 20 in the first impedance section A1 is larger than the line width of the signal conductor layer 20 in the second impedance section A2 and the line width of the signal conductor layer 20 in the third impedance section A3. Thus, the characteristic impedance in the first impedance section A1 is lower than the characteristic impedance in the second impedance section A2 and the characteristic impedance in the third impedance section A3. Accordingly, when the ratio of the first impedance section A1 in the transmission line 10 increases, the insertion loss of the transmission line 10 reduces.

In the transmission line 10, the reflection section A12 is preferably close to the signal conductor layer second end portion t2. Thus, the length of the signal conductor layer 20 from the reflection section A12 to the signal conductor layer second end portion t2 is equal to or shorter than a wavelength of a radio frequency signal transmitted through the transmission line 10. As a result, the influence of reflection in the reflection section A12 increases, and the reflection of a radio frequency signal at the signal conductor layer second end portion t2 is further reduced or prevented.

First Modification

Figure 4:
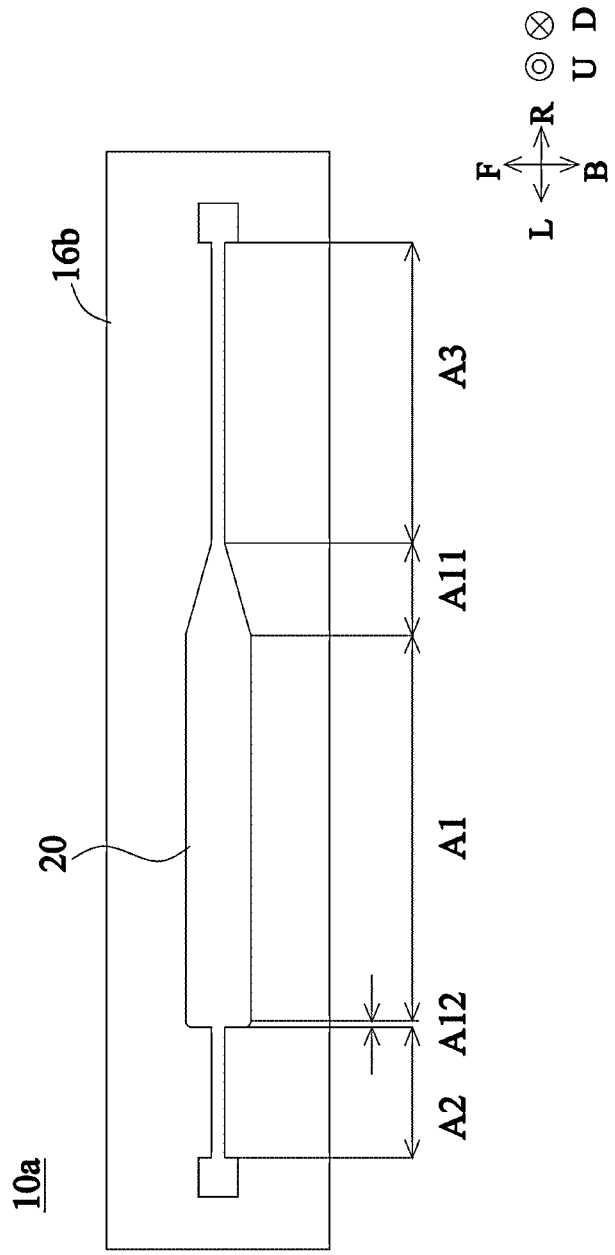
FIG. 4 is a top view of a signal conductor layer and an insulator layer of a transmission line according to a preferred embodiment of the present invention.

Next, a transmission line 10a according to a first modification of a preferred embodiment of the present invention will be described with reference to the drawings. FIG. 4 is a top view of a signal conductor layer 20 and an insulator layer 16b of the transmission line 10a.

The transmission line 10a is different from the transmission line 10 in shape of the signal conductor layer 20. Specifically, in the transmission line 10a, the signal conductor layer 20 in an impedance conversion section A11 has a tapered shape. Specifically, a line width of the signal conductor layer 20 in the impedance conversion section A11 continuously increases from a third impedance section A3 toward a first impedance section A1. Since other structures of the transmission line 10a are the same or substantially the same as those of the transmission line 10, a description thereof is omitted. Thus, a change in characteristic impedance in the impedance conversion section A11 becomes moderate. As a result, the occurrence of reflection of a radio frequency signal in the impedance conversion section A11 is reduced or prevented.

Second Modification

Figure 5:
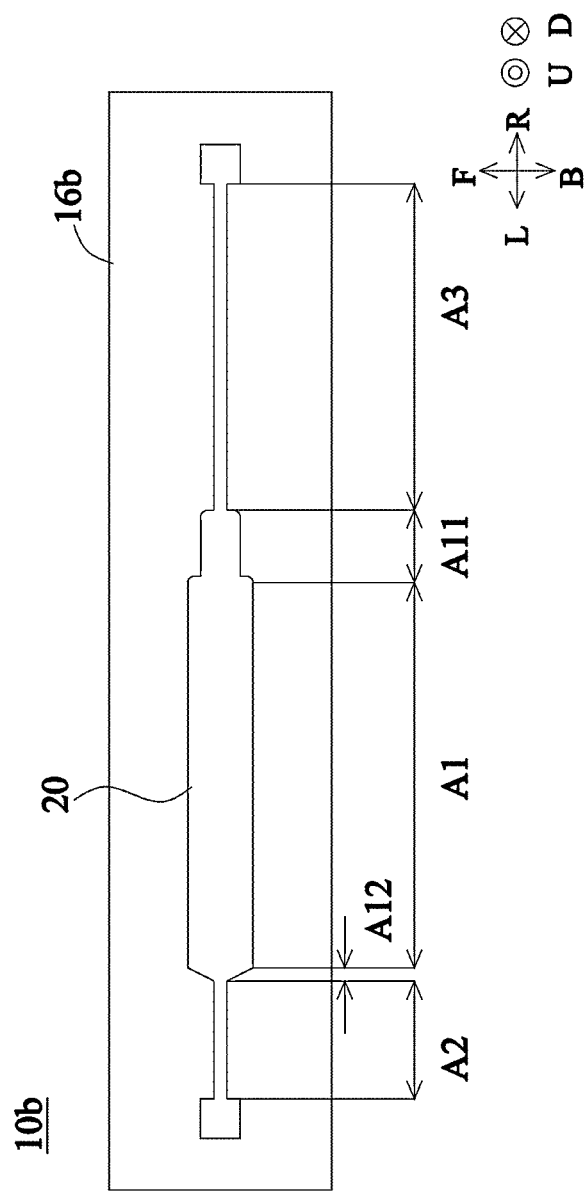
FIG. 5 is a top view of a signal conductor layer and an insulator layer of a transmission line according to a preferred embodiment of the present invention.

Next, a transmission line 10b according to a second modification of a preferred embodiment of the present invention will be described with reference to the drawings. FIG. 5 is a top view of a signal conductor layer 20 and an insulator layer 16b of the transmission line 10b.

The transmission line 10b is different from the transmission line 10 in the shape of the signal conductor layer 20. Specifically, in the transmission line 10b, the signal conductor layer 20 in a reflection section A12 has a tapered shape. Specifically, a line width of the signal conductor layer 20 in the reflection section A12 continuously increases from a second impedance section A2 toward a first impedance section A1. Since other structures of the transmission line 10b are the same or substantially the same as those of the transmission line 10, a description thereof is omitted.

Third Modification

Figure 6:
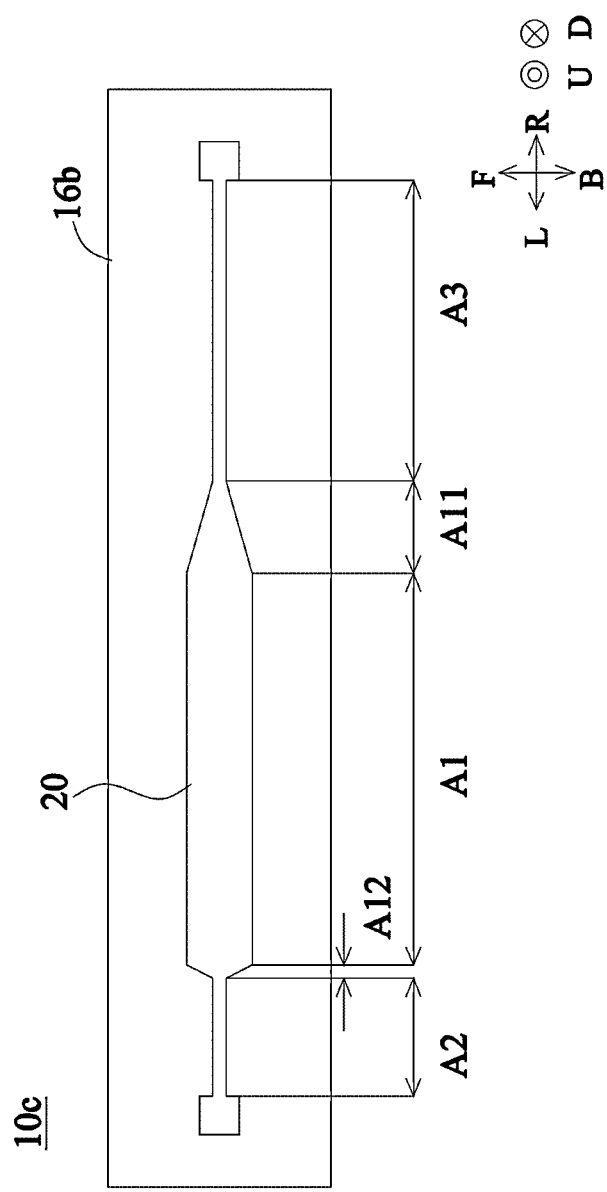
FIG. 6 is a top view of a signal conductor layer and an insulator layer of a transmission line according to a preferred embodiment of the present invention.

Next, a transmission line 10c according to a third modification of a preferred embodiment of the present invention will be described with reference to the drawings. FIG. 6 is a top view of a signal conductor layer 20 and an insulator layer 16b of the transmission line 10c.

The transmission line 10c is different from the transmission line 10 in the shape of the signal conductor layer 20. Specifically, in the transmission line 10c, the signal conductor layer 20 in an impedance conversion section A11 has a tapered shape. The line width of the signal conductor layer 20 in the impedance conversion section A11 continuously increases from a third impedance section A3 toward a first impedance section A1. Thus, the change in the characteristic impedance in the impedance conversion section A11 becomes moderate. As a result, the occurrence of reflection of a radio frequency signal in the impedance conversion section A11 is reduced or prevented.

In the transmission line 10c, the signal conductor layer 20 in a reflection section A12 has a tapered shape. Specifically, a line width of the signal conductor layer 20 in the reflection section A12 continuously increases from a second impedance section A2 toward the first impedance section A1. Since other structures of the transmission line 10c are the same or substantially the same as those of the transmission line 10, a description thereof is omitted.

Fourth Modification

Figure 7:
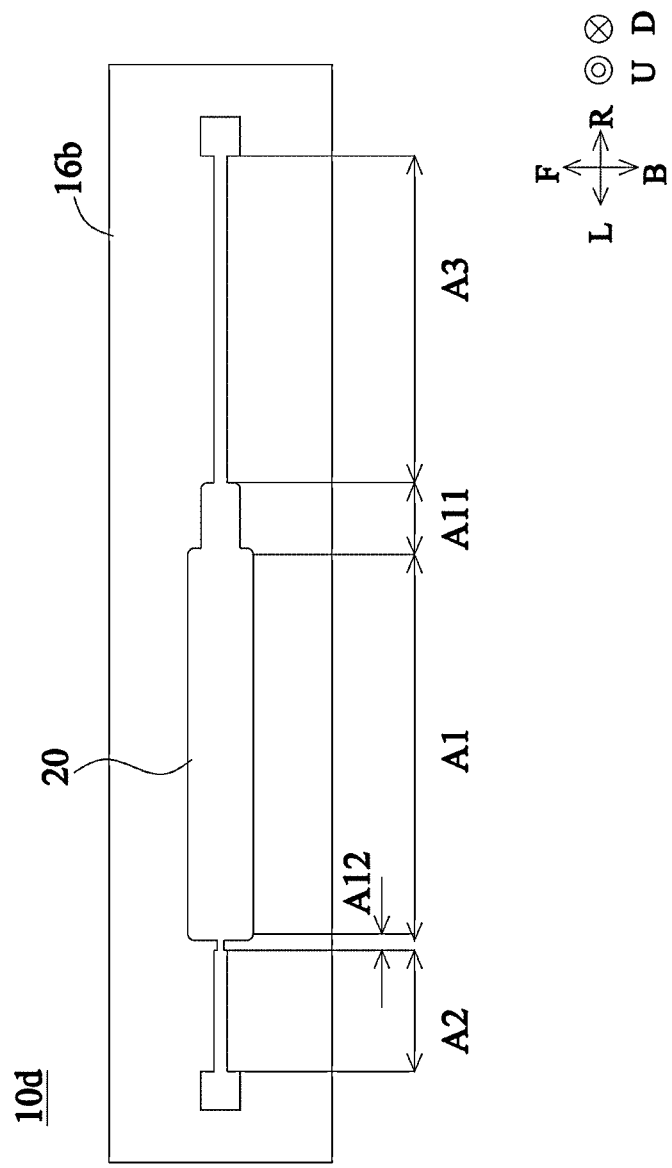
FIG. 7 is a top view of a signal conductor layer and an insulator layer of a transmission line according to a preferred embodiment of the present invention.

Next, a transmission line 10d according to a fourth modification of a preferred embodiment of the present invention will be described with reference to the drawings. FIG. 7 is a top view of a signal conductor layer 20 and an insulator layer 16b of the transmission line 10d.

The transmission line 10d is different from the transmission line 10 in shape of the signal conductor layer 20. In the transmission line 10d, a line width of the signal conductor layer 20 in a reflection section A12 is smaller than a line width of the signal conductor layer 20 in a second impedance section A2. Thus, a change amount of the line width of the signal conductor layer 20 in the reflection section A12 further increases. That is, a change amount of characteristic impedance in the reflection section A12 increases. As a result, reflection of a radio frequency signal is likely to occur in the reflection section A12. Thus, with the use of the transmission line 10d, the occurrence of characteristic impedance mismatching may be reduced or prevented.

Fifth Modification

Figure 8:
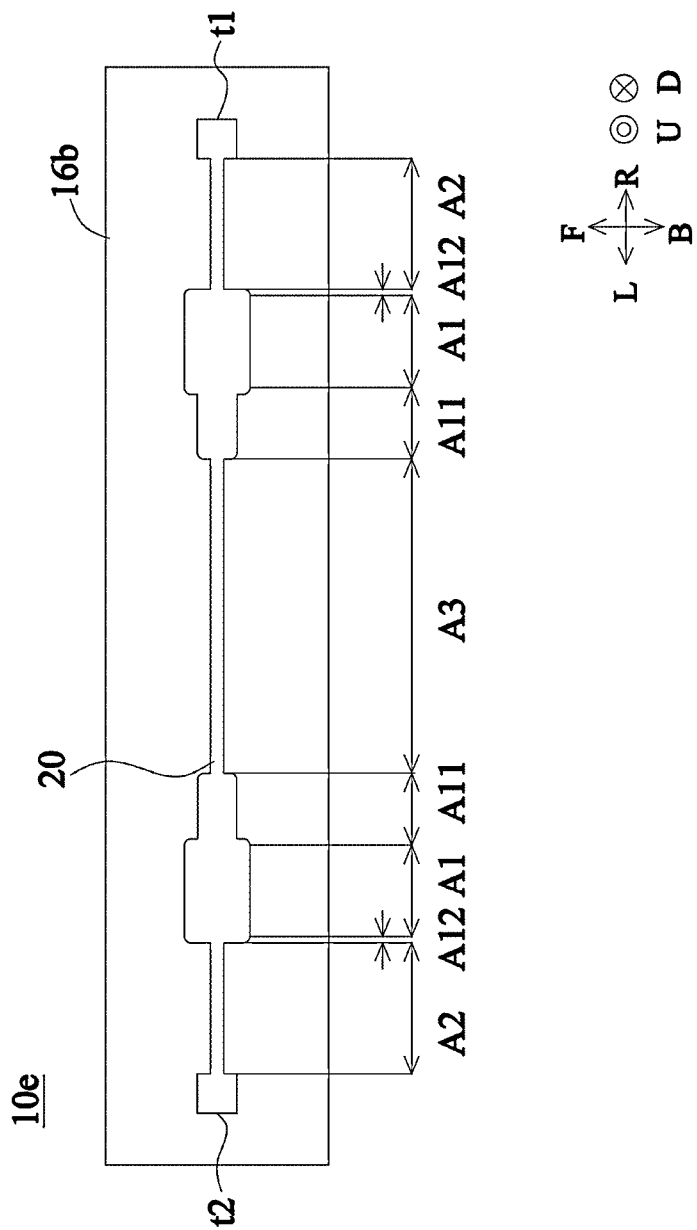
FIG. 8 is a top view of a signal conductor layer and an insulator layer of a transmission line according to a preferred embodiment of the present invention.

Next, a transmission line 10e according to a fifth modification of a preferred embodiment of the present invention will be described with reference to the drawings. FIG. 8 is a top view of a signal conductor layer 20 and an insulator layer 16b of the transmission line 10e.

The transmission line 10e is different from the transmission line 10 in that the signal conductor layer 20 is symmetrical or substantially symmetrical in the left-right direction. More specifically, the transmission line 10e includes two sets of a first impedance section A1, a second impedance section A2, a third impedance section A3, an impedance conversion section A11, and a reflection section A12. In a left portion of the transmission line 10e, the second impedance section A2, the reflection section A12, the first impedance section A1, the impedance conversion section A11, and the third impedance section A3 are continuously arranged in this order from left to right. In a right portion of the transmission line 10e, the second impedance section A2, the reflection section A12, the first impedance section A1, the impedance conversion section A11, and the third impedance section A3 are continuously arranged in this order from right to left. Since other structures of the transmission line 10e are the same or substantially the same as those of the transmission line 10, a description thereof is omitted.

With the use of the transmission line 10e, the occurrence of impedance mismatching in the vicinity of a signal conductor layer first end portion t1 and in the vicinity of a signal conductor layer second end portion t2 of the transmission line 10e is reduced or prevented.

Sixth Modification

Figure 9:
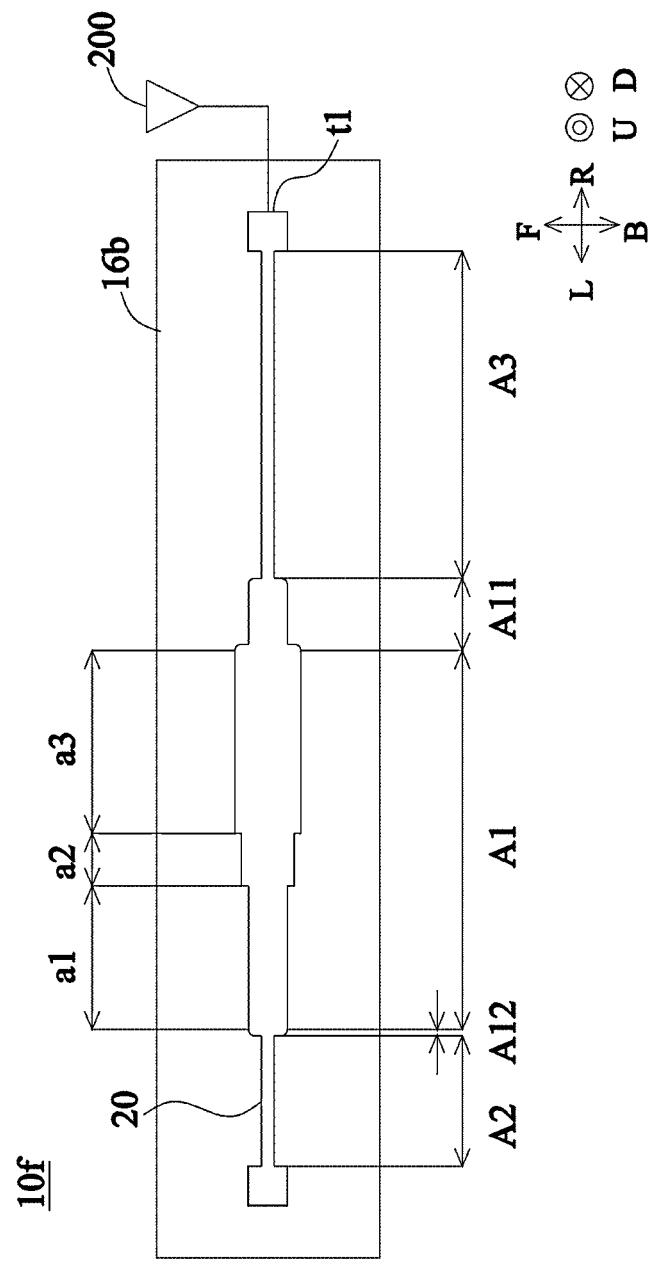
FIG. 9 is a top view of a signal conductor layer and an insulator layer of a transmission line according to a preferred embodiment of the present invention.

Next, a transmission line 10f according to a sixth modification of a preferred embodiment of the present invention will be described with reference to the drawings. FIG. 9 is a top view of a signal conductor layer 20 and an insulator layer 16b of the transmission line 10f.

The transmission line 10f is different from the transmission line 10 in shape of the signal conductor layer 20 and being connected to an antenna 200. Specifically, in the transmission line 10, the line width of the signal conductor layer 20 in the first impedance section A1 is uniform. Meanwhile, in the transmission line 10f, a line width of the signal conductor layer 20 in a first impedance section A1 is not uniform. The first impedance section A1 includes a first section a1, a second section a2, and a third section a3. The first section a1, the second section a2, and the third section a3 are continuously arranged in this order along the signal conductor layer 20. A line width of the signal conductor layer 20 in the first section a1 is smaller than a line width of the signal conductor layer 20 in the second section a2. The line width of the signal conductor layer 20 in the second section a2 is smaller than a line width of the signal conductor layer 20 in the third section a3. Thus, characteristic impedance in the first section a1 is higher than characteristic impedance in the second section a2. The characteristic impedance in the second section a2 is higher than characteristic impedance in the third section a3. The characteristic impedance in the first section a1 is, for example, about 30Ω. The characteristic impedance in the second section a2 is, for example, about 25Ω. The characteristic impedance in the third section a3 is, for example, about 20Ω.

Further, the antenna 200 is electrically connected to a signal conductor layer first end portion t1.

Seventh Modification

Next, a transmission line 10g according to a seventh modification of a preferred embodiment of the present invention will be described with reference to the drawings. FIG. 10 is a sectional view of a left end portion of the transmission line 10g.

The transmission line 10g is different from the transmission line 10 in the structure of an element body 12 and the structure of an interlayer connection conductor v1. The element body 12 has a structure in which a resist layer 18a, insulator layers 16a, 16b, 16c, and 16d, and a resist layer 18b are laminated in this order from top to bottom. A signal conductor layer 20 is provided on an upper main surface of the insulator layer 16c. A first ground conductor layer 22 is provided on an upper main surface of the insulator layer 16a. A second ground conductor layer 24 is provided on a lower main surface of the insulator layer 16d.

The interlayer connection conductor v1 passes through the insulator layers 16a and 16b in the up-down direction. The interlayer connection conductor v1 includes a first via-hole conductor v11 and a second via-hole conductor v12. The first via-hole conductor v11 and the second via-hole conductor v12 respectively pass through the insulator layers 16a and 16b in the up-down direction (lamination direction). The first via-hole conductor v11 and the second via-hole conductor v12 are electrically connected to each other in series.

The first via-hole conductor v11 is connected to an outer electrode 26a. More specifically, an upper end of the first via-hole conductor v11 is connected to the outer electrode 26a. The second via-hole conductor v12 is connected to a signal conductor layer second end portion t2. More specifically, a lower end of the second via-hole conductor v12 is connected to the signal conductor layer second end portion t2.

The transmission line 10g further includes a connection conductor layer 40. The connection conductor layer 40 is provided on an upper main surface of the insulator layer 16b. The connection conductor layer 40 is connected to the first via-hole conductor v11 and the second via-hole conductor v12. Specifically, a lower end of the first via-hole conductor v11 is connected to the connection conductor layer 40. An upper end of the second via-hole conductor v12 is connected to the connection conductor layer 40. Thus, the first via-hole conductor v11 and the second via-hole conductor v12 are electrically connected to each other in series with the connection conductor layer 40 interposed therebetween.

The transmission line 10g further includes via-hole conductors v21, v22, v23, and v24. The via-hole conductors v21 to v24 respectively pass through the insulator layers 16a to 16d in the up-down direction (lamination direction). The via-hole conductors v21 to v24 are electrically connected to each other in series. An upper end of the via-hole conductor v21 is connected to the first ground conductor layer 22. A lower end of the via-hole conductor v25 is connected to the second ground conductor layer 24.

The transmission line 10g further includes connection conductor layers 42 and 44. The connection conductor layer 42 is connected to the via-hole conductor v21 and the via-hole conductor v22. The connection conductor layer 44 is connected to the via-hole conductor v22 and the via-hole conductor v23. Thus, the via-hole conductors v21 to v24 are electrically connected to each other in series with the connection conductor layers 42 and 44 interposed among the via-hole conductors V21 to V24.

In the transmission line 10g described above, parasitic capacitance is generated between the connection conductor layer 40 and the first ground conductor layer 22 as illustrated in FIG. 10. Further, parasitic capacitance is generated between the connection conductor layer 40 and the connection conductor layer 42. Thus, characteristic impedance tends to change in the interlayer connection conductor v1. Accordingly, it is particularly preferable that the transmission line 10g include a first impedance section A1, a second impedance section A2, a third impedance section A3, an impedance conversion section A11, and a reflection section A12 (e.g., FIG. 2).

Eighth Modification

Figure 11:
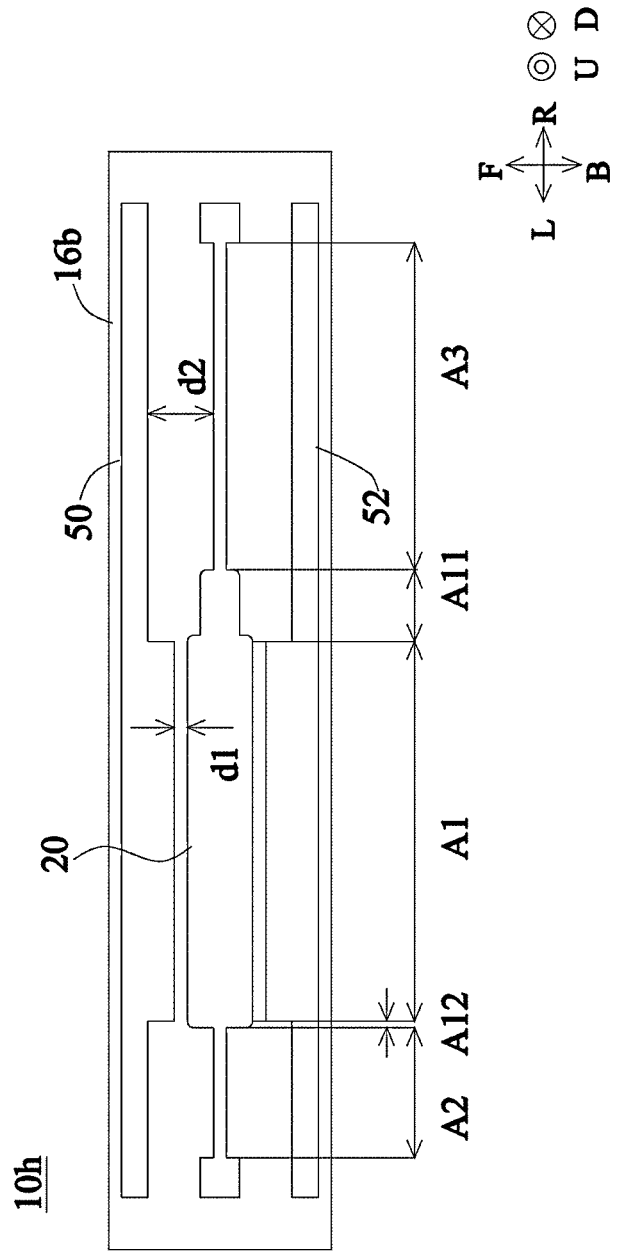
FIG. 11 is a top view of a signal conductor layer, ground conductor layers, and an insulator layer of a transmission line according to a preferred embodiment of the present invention.

Next, a transmission line 10h according to an eighth modification of a preferred embodiment of the present invention will be described with reference to the drawings. FIG. 11 is a top view of a signal conductor layer 20, ground conductor layers 50 and 52, and an insulator layer 16b of the transmission line 10h.

The transmission line 10h is different from the transmission line 10 by including the ground conductor layers 50 and 52. More specifically, the ground conductor layers 50 and 52 are provided on an upper main surface of the insulator layer 16b. The ground conductor layer 50 is provided in front of the signal conductor layer 20. The ground conductor layer 50 extends in the left-right direction. A distance d1 between the ground conductor layer 50 and the signal conductor layer 20 in a first impedance section A1 is smaller than a distance d2 between the ground conductor layer 50 and the signal conductor layer 20 in a second impedance section A2, a third impedance section A3, an impedance conversion section A11, and a reflection section A12. Thus, capacitance generated between the ground conductor layer 50 and the signal conductor layer 20 in the first impedance section A1 is larger than capacitance generated between the ground conductor layer 50 and the signal conductor layer 20 in the second impedance section A2, the third impedance section A3, the impedance conversion section A11, and the reflection section A12. Since the ground conductor layer 50 and the ground conductor layer 52 are symmetrical or substantially symmetrical in the front-back direction, a description of the ground conductor layer 52 will be omitted. In the transmission line 10h described above, characteristic impedance in the first impedance section A1 becomes lower than characteristic impedance in the second impedance section A2, characteristic impedance in the third impedance section A3, characteristic impedance in the impedance conversion section A11, and characteristic impedance in the reflection section A12.

As described above, the characteristic impedance in the first impedance section A1, the characteristic impedance in the second impedance section A2, the characteristic impedance in the third impedance section A3, the characteristic impedance in the impedance conversion section A11, and the characteristic impedance in the reflection section A12 may be adjusted by the ground conductor layers 50 and 52. In the case above, a line width of the signal conductor layer 20 may be uniform over the entire signal conductor layer 20.

Ninth Modification

Figure 12:
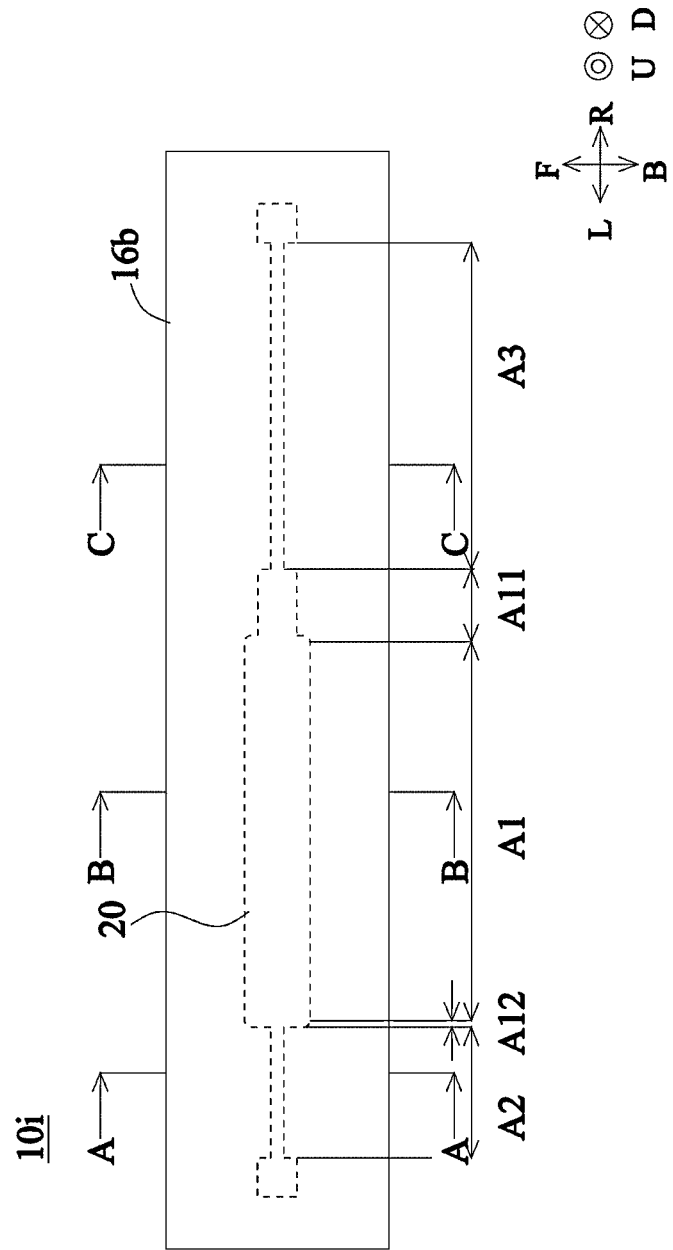
FIG. 12 is a top view of a transmission line according to a preferred embodiment of the present invention.

Next, a transmission line 10i according to a ninth modification of a preferred embodiment of the present invention will be described with reference to the drawings. FIG. 12 is a top view of the transmission line 10i. In FIG. 12, a signal conductor layer 20 is indicated by a dotted line. FIG. 13 is a sectional view of the transmission line 10i taken along line B-B in FIG. 12. FIG. 14 is a sectional view of the transmission line 10i taken along line A-A and line C-C in FIG. 12.

The transmission line 10i is different from the transmission line 10h by including a ground conductor layer 54. The ground conductor layer 54 is provided below the signal conductor layer 20 and above a second ground conductor layer 24. In a first impedance section A1, the ground conductor layer 54 overlaps the signal conductor layer 20 when viewed in the up-down direction as illustrated in FIG. 13. Meanwhile, in a second impedance section A2, a third impedance section A3, an impedance conversion section A11, and a reflection section A12 as shown in FIG. 12, the ground conductor layer 54 does not overlap the signal conductor layer 20 when viewed in the up-down direction as illustrated in FIG. 14. Thus, capacitance generated between the signal conductor layer 20 and the ground conductor layer 54 in the first impedance section A1 is larger than capacitance generated between the signal conductor layer 20 and the ground conductor layer 54 in the second impedance section A2, the third impedance section A3, the impedance conversion section A11, and the reflection section A12. As a result, characteristic impedance in the first impedance section A1 becomes lower than characteristic impedance in the second impedance section A2, characteristic impedance in the third impedance section A3, characteristic impedance in the impedance conversion section A11, and characteristic impedance in the reflection section A12.

As described above in FIG. 12, the characteristic impedance in the first impedance section A1, the characteristic impedance in the second impedance section A2, the characteristic impedance in the third impedance section A3, the characteristic impedance in the impedance conversion section A11, and the characteristic impedance in the reflection section A12 may be adjusted with the ground conductor layer 54. In the case above, a line width of the signal conductor layer 20 may be uniform or substantially uniform over the entire signal conductor layer 20.

Other Preferred Embodiments

The signal transmission line according to the present invention is not limited to the transmission lines 10 and 10a to 10i according to preferred embodiments of the present invention and modifications thereof, and can be changed within the scope of the present invention. Further, the configurations of the transmission lines 10 and 10a to 10i can be combined.

In the transmission lines 10 and 10a to 10i according to preferred embodiments of the present invention and modifications thereof, the element body 12 does not have to be a laminated structure including multiple insulator layers that are laminated.

In the transmission lines 10 and 10a to 10i according to preferred embodiments of the present invention and modifications thereof, the signal conductor layer 20 may have a shape other than a linear shape extending in the left-right direction. The signal conductor layer 20 may be curved when viewed in the up-down direction, for example.

In the transmission lines 10 and 10a to 10i according to preferred embodiments of the present invention and modifications thereof, there a section other than the first impedance section A1, the second impedance section A2, the third impedance section A3, the impedance conversion section A11, and the reflection section A12 may be further included.

In the transmission lines 10 and 10a to 10i according to preferred embodiments of the present invention and modifications thereof, the characteristic impedance in the second impedance section A2 does not have to be equal or substantially equal to the characteristic impedance in the third impedance section A3. Further, the characteristic impedance in the second impedance section A2 and the characteristic impedance in the third impedance section A3 do not have to be about 50Ω.

In the transmission lines 10 and 10a to 10i according to preferred embodiments of the present invention and modifications thereof, the characteristic impedance in the reflection section A12 may be lower than the characteristic impedance in the first impedance section A1. The characteristic impedance in the reflection section A12 may be higher than the characteristic impedance in the second impedance section A2.

In the transmission lines 10 and 10a to 10i according to preferred embodiments of the present invention and modifications thereof, the characteristic impedance in the impedance conversion section A11 may be lower than the characteristic impedance in the first impedance section A1. The characteristic impedance in the impedance conversion section A11 may be higher than the characteristic impedance in the third impedance section A3.

In the transmission lines 10 and 10a to 10i according to preferred embodiments of the present invention and modifications thereof, the length of the reflection section A12 may be equal to or longer than the length of the impedance conversion section A11.

In the transmission lines 10, 10a to 10d, and 10f to 10i according to preferred embodiments of the present invention and modifications thereof, the length of the signal conductor layer 20 from the reflection section A12 to the signal conductor layer second end portion t2 may be equal to or longer than the length of the signal conductor layer 20 from the impedance conversion section A11 to the signal conductor layer first end portion t1.

In the transmission lines 10 and 10a to 10i according to preferred embodiments of the present invention and modifications thereof, the length of the signal conductor layer 20 in the impedance conversion section A11 does not have to be equal or substantially equal to the total length of an integer multiple of a half-wavelength of a radio frequency signal transmitted through the transmission line 10 and one fourth of a wavelength of the radio frequency signal.

In the transmission lines 10 and 10a to 10i according to preferred embodiments of the present invention and modifications thereof, a chip capacitor may be mounted in the second impedance section A2 and the reflection section A12.

In the transmission lines 10 and 10a to 10i according to preferred embodiments of the present invention and modifications thereof, the line width of the signal conductor layer 20 in the reflection section A12 may be smaller than the line width of the signal conductor layer 20 in the second impedance section A2. The line width of the signal conductor layer 20 in the reflection section A12 may be larger than the line width of the signal conductor layer 20 in the first impedance section A1.

In the transmission lines 10 and 10a to 10i according to preferred embodiments of the present invention and modifications thereof, the line width of the signal conductor layer 20 in the impedance conversion section A11 may be smaller than the line width of the signal conductor layer 20 in the third impedance section A3. The line width of the signal conductor layer 20 in the impedance conversion section A11 may be larger than the line width of the signal conductor layer 20 in the first impedance section A1.

In the transmission lines 10 and 10a to 10i according to preferred embodiments of the present invention and modifications thereof, the first ground conductor layer 22 and the second ground conductor layer 24 are not essential elements. Accordingly, the transmission line may include one of the first ground conductor layer 22 and the second ground conductor layer 24, or the transmission line does not have to include the first ground conductor layer 22 or the second ground conductor layer 24.

While preferred embodiments of the present invention have been described above, it is to be understood that variations and modifications will be apparent to those skilled in the art without departing scope and spirit of the present invention. The scope of the present invention, therefore, is to be determined solely by the following claims.

What is claimed is:

1. A transmission line, comprising:
an element body; and
a signal conductor layer in the element body and having a linear shape; wherein
the transmission line includes a first impedance section, a second impedance section, a third impedance section, an impedance conversion section, and a reflection section;
the second impedance section, the reflection section, the first impedance section, the impedance conversion section, and the third impedance section are positioned in this order along the signal conductor layer;
a characteristic impedance in the first impedance section is lower than a characteristic impedance in the second impedance section and a characteristic impedance in the third impedance section;
a change amount of characteristic impedance per unit length in the reflection section is larger than a change amount of characteristic impedance per unit length in the impedance conversion section;
the reflection section is between the first impedance section and the second impedance section and includes a side extending in a front-back direction of the transmission line; and
line widths of the first, second, and third impedance sections are each constant or substantially constant.

2. The transmission line according to claim 1, wherein the characteristic impedance in the reflection section is equal to or higher than the characteristic impedance in the first impedance section and equal to or lower than the characteristic impedance in the second impedance section; and
the characteristic impedance in the impedance conversion section is equal to or higher than the characteristic impedance in the first impedance section and equal to or lower than the characteristic impedance in the third impedance section.

3. The transmission line according to claim 1, wherein a length of the reflection section is shorter than a length of the impedance conversion section.

4. The transmission line according to claim 1, wherein the signal conductor layer includes a signal conductor layer first end portion and a signal conductor layer second end portion;
the second impedance section includes a second impedance section first end and a second impedance section second end;
the reflection section is in contact with the second impedance section first end; and
the second impedance section second end is closer to the signal conductor layer second end portion than the second impedance section first end is to the signal conductor layer second end portion.

5. The transmission line according to claim 4, wherein the element body includes multiple insulator layers laminated in a lamination direction; and
the transmission line further includes:
an interlayer connection conductor penetrating through at least one insulator layer of the multiple insulator layers in the lamination direction; and
the interlayer connection conductor is connected to the signal conductor layer second end portion.

6. The transmission line according to claim 5, wherein the interlayer connection conductor includes a first via-hole conductor and a second via-hole conductor;
the first via-hole conductor and the second via-hole conductor pass through the at least one insulator layer in the lamination direction and are electrically connected to each other in series; and
the transmission line further includes:
a connection conductor layer connected to the first via-hole conductor and the second via-hole conductor; and
the second via-hole conductor is connected to the signal conductor layer second end portion.

7. The transmission line according to claim 4, wherein a connector is electrically connected to the signal conductor layer second end portion.

8. The transmission line according to claim 4, wherein an antenna is electrically connected to the signal conductor layer first end portion.

9. The transmission line according to claim 4, wherein a length of the signal conductor layer from the reflection section to the signal conductor layer second end portion is shorter than a length of the signal conductor layer from the impedance conversion section to the signal conductor layer first end portion.

10. The transmission line according to claim 1, wherein a length of the signal conductor layer in the impedance conversion section is equal or substantially equal to a total length of an integer multiple of a half-wavelength of a radio frequency signal transmitted through the transmission line and one fourth of a wavelength of the radio frequency signal.

11. The transmission line according to claim 1, wherein the characteristic impedance in the second impedance section and the characteristic impedance in the third impedance section are about 50Ω.

12. The transmission line according to claim 1, wherein each of the second impedance section and the reflection section is provided without a chip capacitor being located in either of the second impedance section and the reflection section.

13. The transmission line according to claim 1, wherein a change amount of the characteristic impedance in the impedance conversion section is larger than a change amount of the characteristic impedance in the first impedance section, a change amount of the characteristic impedance in the second impedance section, and a change amount of the characteristic impedance in the third impedance section; and
a change amount of the characteristic impedance in the reflection section is larger than the change amount of the characteristic impedance in the first impedance section, the change amount of the characteristic impedance in the second impedance section, and the change amount of the characteristic impedance in the third impedance section.

14. The transmission line according to claim 1, wherein the characteristic impedance of the first impedance section is constant or substantially constant at a first value, the characteristic impedance of the second impedance section is constant or substantially constant at a second value, and the characteristic impedance of the third impedance section is constant or substantially constant at a third value.

15. A transmission line, comprising:
an element body; and
a signal conductor layer in the element body; wherein
the transmission line includes a first impedance section, a second impedance section, a third impedance section, an impedance conversion section, and a reflection section;
the second impedance section, the reflection section, the first impedance section, the impedance conversion section, and the third impedance section are positioned in this order along the signal conductor layer;
a line width of the signal conductor layer in the first impedance section is larger than a line width of the signal conductor layer in the second impedance section and a line width of the signal conductor layer in the third impedance section; and
a change amount of a line width of the signal conductor layer per unit length in the reflection section is larger than a change amount of a line width of the signal conductor layer per unit length in the impedance conversion section.

16. The transmission line according to claim 15, wherein
the line width of the signal conductor layer in the reflection section is equal to or larger than the line width of the signal conductor layer in the second impedance section and equal to or smaller than the line width of the signal conductor layer in the first impedance section; and
the line width of the signal conductor layer in the impedance conversion section is equal to or larger than the line width of the signal conductor layer in the third impedance section and is equal to or smaller than the line width of the signal conductor layer in the first impedance section.

17. The transmission line according to claim 16, wherein
the line width of the signal conductor layer in the reflection section increases from the second impedance section toward the first impedance section;
the line width of the signal conductor layer in the impedance conversion section increases from the third impedance section toward the first impedance section; and
an increase rate of the line width of the signal conductor layer in the reflection section is larger than an increase rate of the line width of the signal conductor layer in the impedance conversion section.

18. The transmission line according to claim 16, wherein a length of the reflection section is shorter than a length of the impedance conversion section.

19. The transmission line according to claim 16, wherein
the signal conductor layer includes a signal conductor layer first end portion and a signal conductor layer second end portion;
the second impedance section includes a second impedance section first end and a second impedance section second end;
the reflection section is in contact with the second impedance section first end; and
the second impedance section second end is closer to the signal conductor layer second end portion than the second impedance section first end is to the signal conductor layer second end portion.

20. The transmission line according to claim 19, wherein the element body includes multiple insulator layers laminated in a lamination direction; and
the transmission line further includes:
an interlayer connection conductor penetrating through at least one insulator layer of the multiple insulator layers in the lamination direction; and
the interlayer connection conductor is connected to the signal conductor layer second end portion.

21. The transmission line according to claim 20, wherein
the interlayer connection conductor includes a first via-hole conductor and a second via-hole conductor;
the first via-hole conductor and the second via-hole conductor pass through the at least one insulator layer in the lamination direction and are electrically connected to each other in series; and
the transmission line further includes:
a connection conductor layer connected to the first via-hole conductor and the second via-hole conductor, and
the second via-hole conductor is connected to the signal conductor layer second end portion.

22. The transmission line according to claim 19, wherein a connector is electrically connected to the signal conductor layer second end portion.

23. The transmission line according to claim 19, wherein an antenna is electrically connected to the signal conductor layer first end portion.

24. The transmission line according to claim 19, wherein a length of the signal conductor layer from the reflection section to the signal conductor layer second end portion is shorter than a length of the signal conductor layer from the impedance conversion section to the signal conductor layer first end portion.

25. The transmission line according to claim 15, wherein a length of the signal conductor layer in the impedance conversion section is equal or substantially equal to a total length of an integer multiple of a half-wavelength of a radio frequency signal transmitted through the transmission line and one fourth of a wavelength of the radio frequency signal.

26. The transmission line according to claim 15, wherein a characteristic impedance in the second impedance section and a characteristic impedance in the third impedance section are about 50Ω.

27. The transmission line according to claim 15, wherein each of the second impedance section and the reflection section is provided without a chip capacitor being located in either of the second impedance section and the reflection section.

28. The transmission line according to claim 15, wherein
a change amount of characteristic impedance in the impedance conversion section is larger than a change amount of characteristic impedance in the first impedance section, a change amount of characteristic impedance in the second impedance section, and a change amount of characteristic impedance in the third impedance section; and
a change amount of characteristic impedance in the reflection section is larger than the change amount of the characteristic impedance in the first impedance section, the change amount of the characteristic impedance in the second impedance section, and the change amount of the characteristic impedance in the third impedance section.

29. A transmission line, comprising:
an element body; and
a signal conductor layer in the element body and having a linear shape; wherein
the transmission line includes a first impedance section, a second impedance section, and a third impedance section;

the second impedance section, the first impedance section, and the third impedance section are positioned in this order along the signal conductor layer;

a characteristic impedance in the first impedance section is lower than a characteristic impedance in the second impedance section and a characteristic impedance in the third impedance section;

an impedance of the first impedance section is constant or substantially constant at a first value, an impedance of the second impedance section is constant or substantially constant at a second value, and an impedance of the third impedance section is constant or substantially constant at a third value; and a change amount of characteristic impedance per unit length in a region changing from the second impedance section to the first impedance section is larger than a change amount of characteristic impedance per unit length in a region changing from the first impedance section to the third impedance section.

\* \* \* \* \*